(12) United States Patent
di Vincenzo et al.

(10) Patent No.: US 12,731,639 B2
(45) **Date of Patent: *Sep. 8, 2026**

(54) FORWARD-LOOKING DETERMINATION OF READ VOLTAGE USING MEMORY CELL PATTERNS

(71) Applicant: Micron Technology, Inc., Boise, ID (US)

(72) Inventors: Umberto di Vincenzo, Capriate San Gervasio (IT); Ferdinando Bedeschi, Biassono (IT); Christian Marc Benoit Caillat, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 80 days.

This patent is subject to a terminal disclaimer.

(21) Appl. No.: 17/855,483

(22) Filed: Jun. 30, 2022

(65) Prior Publication Data

US 2023/0395147 A1 Dec. 7, 2023

Related U.S. Application Data

(60) Provisional application No. 63/347,934, filed on Jun. 1, 2022.

(51) Int. Cl.
*G11C 13/00* (2006.01)

(52) U.S. Cl.
CPC ........ *G11C 13/004* (2013.01); *G11C 13/0004* (2013.01); *G11C 13/0069* (2013.01); *G11C 2213/71* (2013.01)

(58) Field of Classification Search
CPC .............. G11C 13/004; G11C 13/0004; G11C 13/0069; G11C 13/0026; G11C 13/0028; G11C 13/003; G11C 2213/71; G11C 2213/15; G11C 11/5678
See application file for complete search history.

(56) References Cited

U.S. PATENT DOCUMENTS

| | | | | |
|---|---|---|---|---|
| 7,810,032 | B2 * | 10/2010 | Bauchot .................. | G06F 40/18 717/160 |
| 10,431,301 | B2 | 10/2019 | Mirichigni et al. | |
| 10,566,052 | B2 | 2/2020 | Mirichigni et al. | |
| 10,600,480 | B2 | 3/2020 | Mirichigni et al. | |
| 2007/0253242 | A1 * | 11/2007 | Parkinson .......... | G11C 13/0026 365/163 |
| 2012/0221917 | A1 | 8/2012 | Bueb et al. | |
| 2019/0243708 | A1 | 8/2019 | Cha et al. | |
| 2022/0050748 | A1 | 2/2022 | Kim et al. | |

(Continued)

FOREIGN PATENT DOCUMENTS

WO 2021229260 11/2021

*Primary Examiner* — Sultana Begum
(74) *Attorney, Agent, or Firm* — Greenberg Traurig

(57) ABSTRACT

Systems, methods, and apparatus for a memory device that uses multiple groups of pattern cells to select a voltage for reading memory cells. In one approach, a controller applies different magnitude levels of voltages to each of the groups of pattern cells. The controller determines which of the groups have pattern cells that first switch (e.g., switch at the lowest magnitude of applied voltage). Based on identifying the first group to switch, the controller selects a read voltage. The selected read voltage is used to read data cells (e.g., corresponding to a codeword).

22 Claims, 11 Drawing Sheets

(56) References Cited

U.S. PATENT DOCUMENTS

2023/0067396 A1 3/2023 Sarpatwari et al.
2023/0110946 A1 4/2023 Muzzetto et al.
2023/0386543 A1* 11/2023 Tran .................... G11C 11/1673
2023/0420025 A1 12/2023 Di Vincenzo et al.
2024/0071488 A1 2/2024 Bedeschi

* cited by examiner

130
Bitline Drivers 137
Array of Memory Cells 133
Memory Cell 103
Controller 131
Read Manager 113
Wordline Drivers 135

141
Bitline Driver 147
143
Memory Cell 103
Controller 131
Read Manager 113
Wordline Driver 145

FORWARD-LOOKING DETERMINATION OF READ VOLTAGE USING MEMORY CELL PATTERNS

RELATED APPLICATIONS

The present application claims priority to Prov. U.S. Pat. App. Ser. No. 63/347,934 filed Jun. 1, 2022, the entire disclosures of which application are hereby incorporated herein by reference.

FIELD OF THE TECHNOLOGY

At least some embodiments disclosed herein relate to memory devices in general, and more particularly, but not limited to memory devices that use multiple patterns to select a voltage for reading memory cells.

BACKGROUND

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory cells may maintain their stored logic state for extended periods of time even in the absence of an external power source. Volatile memory cells may lose their stored state over time unless they are periodically refreshed by an external power source.

A storage device is an example of a memory device. Typical computer storage devices have controllers that receive data access requests from host computers and perform programmed computing tasks to implement the requests in ways that may be specific to the media and structure configured in the storage devices. In one example, a memory controller manages data stored in memory and communicates with a computer device. In some examples, memory controllers are used in solid state drives for use in mobile devices or laptops, or media used in digital cameras.

Firmware can be used to operate a memory controller for a particular storage device. In one example, when a computer system or device reads data from or writes data to a memory device, it communicates with the memory controller.

Memory devices typically store data in memory cells. In some cases, memory cells exhibit non-uniform, variable electrical characteristics that may originate from various factors including statistical process variations, cycling events (e.g., read or write operations on the memory cells), or a drift (e.g., a change in resistance of a chalcogenide alloy), among others.

In one example, reading a set of data (e.g., a codeword, a page) is carried out by determining a read voltage (e.g., an estimated median of threshold voltages) of memory cells that store the set of data. In some cases, a memory device may include an array of PCM cells arranged in a 3D architecture, such as a cross-point architecture to store the set of data. PCM cells in a cross-point architecture may represent a first logic state (e.g., a logic 1, a SET state) associated with a first set of threshold voltages, or a second logic state (e.g., a logic 0, a RESET state) associated with a second set of threshold voltages. In some cases, data may be stored using encoding (e.g., error correction coding (ECC)) to recover data from errors in the data stored in the memory cells.

For resistance variable memory cells (e.g., PCM cells), one of a number of states (e.g., resistance states) can be set. For example, a single level cell (SLC) may be programmed to one of two states (e.g., logic 1 or 0), which can depend on whether the cell is programmed to a resistance above or below a particular level. As an additional example, various resistance variable memory cells can be programmed to one of multiple different states corresponding to multiple data states, e.g., 10, 01, 00, 11, 111, 101, 100, 1010, 1111, 0101, 0001, etc. Such cells may be referred to as multi state cells, multi-digit cells, and/or multi-level cells (MLCs).

The state of a resistance variable memory cell can be determined (e.g., read) by sensing current through the cell responsive to an applied interrogation voltage. The sensed current, which varies based on the resistance of the cell, can indicate the state of the cell (e.g., the binary data stored by the cell). The resistance of a programmed resistance variable memory cell can drift (e.g., shift) over time. Resistance drift can result in erroneous sensing of a resistance variable memory cell (e.g., a determination that the cell is in a state other than that to which it was programmed, among other issues).

A PCM cell, for example, may be programmed to a reset state (amorphous state) or a set state (crystalline state). A reset pulse (e.g., a pulse used to program a cell to a reset state) can include a relatively high current pulse applied to the cell for a relatively short period of time such that the phase change material of the cell melts and rapidly cools, resulting in a relatively small amount of crystallization. Conversely, a set pulse (e.g., a pulse used to program a cell to a set state) can include a relatively lower current pulse applied to the cell for a relatively longer time interval and with a slower quenching speed, which results in an increased crystallization of the phase change material.

A programming signal can be applied to a selected memory cell to program the cell to a target state. A read signal can be applied to a selected memory cell to read the cell (e.g., to determine the state of the cell). The programming signal and the read signal can be current and/or voltage pulses, for example.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
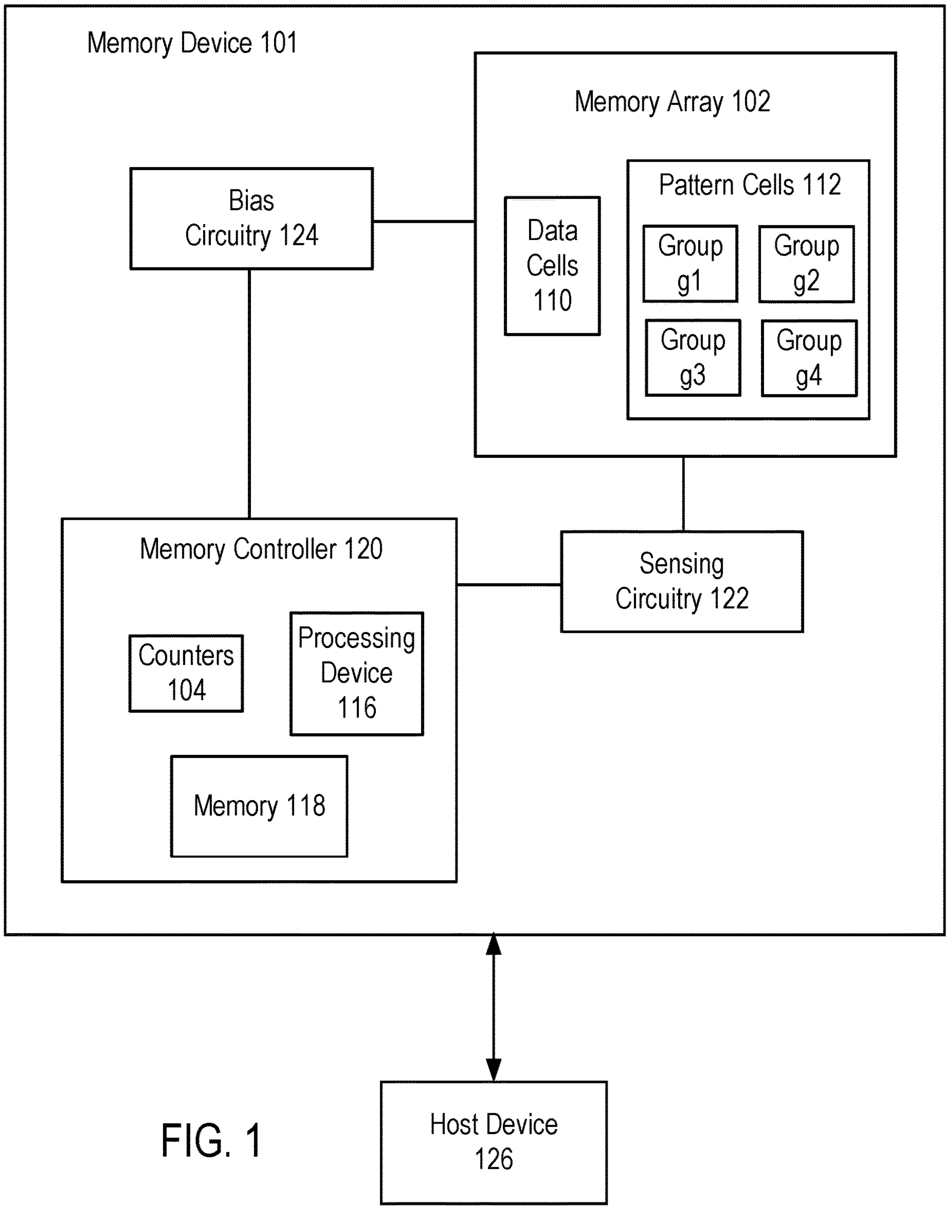
FIG. 1 shows a memory device that uses multiple patterns to select a voltage for performing read operations, in accordance with some embodiments.

The following disclosure describes various embodiments for memory devices that use multiple patterns to select a voltage for reading memory cells in a memory array (e.g., a three-dimensional cross-point memory array). At least some embodiments herein relate to memory devices that use bipolar operations for a memory array. In one example, bipolar select voltages are used to select memory cells of the memory array. In one example, the memory cells are arranged in a cross-point architecture. In one example, each memory cell is formed using a single select device. In one example, the select device includes a chalcogenide material that snaps when a sufficient voltage is applied across the memory cell.

The memory device may, for example, store data used by a host device (e.g., a computing device of an autonomous vehicle, or another computing device that accesses data stored in the memory device). In one example, the memory device is a solid-state drive mounted in an electric vehicle.

In some cases, a memory device may include an array of memory cells arranged in a three-dimensional (3D) architecture, such as a cross-point architecture, to store the set of data. The memory cells in a cross-point architecture may, for example, represent a first logic state (e.g., a logic 1, a SET state) associated with a first set of threshold voltages, or a second logic state (e.g., a logic 0, a RESET state) associated with a second set of threshold voltages.

In other embodiments, the memory cells may be arranged in a three-dimensional (3D) vertical architecture. A 3D vertical architecture may include memory cells located at the crossing between a vertical access line (e.g., a bitline pillar), and each one of a plurality of second access lines (e.g., wordlines), formed in horizontal planes or decks parallel to each other.

More generally, an integrated circuit memory cell, such as a memory cell in a cross-point memory or a 3D vertical array, can be programmed to store data by the way of its state at a voltage applied across the memory cell. For example, if a memory cell is configured or programmed in such a state that allows a substantial current to pass the memory cell at a voltage in a predefined voltage region, the memory cell is considered to have been configured or programmed to store a first bit value (e.g., one or zero); and otherwise, the memory cell is storing a second bit value (e.g., zero or one).

Optionally, a memory cell can be configured or programmed to store more than one bit of data by being configured or programmed, for example, to have a threshold voltage in one of more than two separate voltage regions.

The threshold voltage of a memory cell is such that when the voltage applied across the memory cell is increased to above the threshold voltage, the memory cell changes rapidly or abruptly, snaps (e.g., for a chalcogenide memory cell), or jumps from a non-conductive state to a conductive state. The non-conductive state allows a small leak current to go through the memory cell; and in contrast, the conductive state allows more than a threshold amount of current to go through. Thus, a memory device can use a sensor (e.g., sense amplifier) to detect the change, or determine the conductive/non-conductive state of the memory device at one or more applied voltages, to evaluate or classify the level of the threshold voltage of the memory cell and thus its stored data.

The threshold voltage of a memory cell being configured/programmed to be in different voltage regions can be used to represent different data values stored in the memory cell. For example, the threshold voltage of the memory cell can be programmed to be in any of four predefined voltage regions; and each of the regions can be used to represent the bit values of a different two-bit data item. Thus, when given a two-bit data item, one of the four voltage regions can be selected based on a mapping between two-bit data items and voltage regions; and the threshold voltage of the memory cell can be adjusted, programmed, or configured to be in the selected voltage region to represent or store the given two-bit data item. To retrieve, determine, or read the data item from the memory cell, one or more read voltages can be applied across the memory cell to determine which of the four voltage regions contain the threshold voltage of the memory cell. The identification of the voltage region that contains the threshold voltage of the memory cell provides the two-bit data item that has been stored, programmed, or written into the memory cell.

For example, a memory cell can be configured or programmed to store a one-bit data item in a Single Level Cell (SLC) mode, or a two-bit data item in a Multi-Level Cell (MLC) mode, or a three-bit data item in a Triple Level Cell (TLC) mode, or a four-bit data item in Quad-Level Cell (QLC) mode.

The threshold voltage of a memory cell can change or drift over a period of time, usage, and/or read operations, and in response to certain environmental factors, such as temperature changes. The rate of change or drift can increase as the memory cell ages. The change or drift can result in errors in determining, retrieving, or reading the data item back from the memory cell.

Random errors in reading memory cells can be detected and corrected using redundant information. Data to be stored into memory cells can be encoded to include redundant information to facilitate error detection and recovery. When data encoded with redundant information is stored in a memory sub-system, the memory sub-system can detect errors in data represented by the voltage regions of the threshold voltages of the memory cells and/or recover the original data that is used to generate the data used to program the threshold voltages of the memory cells. The recovery operation can be successful (or have a high probability of success) when the data represented by the threshold voltages of the memory cells and thus retrieved directly from the memory cells in the memory sub-system contains fewer errors, or the bit error rate in the retrieved data is low and/or when the amount of redundant information is high. For example, error detection and data recovery can be performed using techniques such as Error Correction Code (ECC), Low-Density Parity-Check (LDPC) code, etc.

When the data retrieved from the memory cells of the memory sub-system has too many errors for successful decoding, the memory sub-system may retry the execution of the read command. Voltage pulses applied during read retry can cause threshold voltages previously programmed into separate regions to move closer to each other and into a common region and thus reduce the readability of memory cells.

Read retry can be used in memory operation systems to perform a re-read operation on a target codeword (CW), with the desired goal of achieving various benefits including error correction, re-programming, etc. In some cases, a read retry may be triggered directly after determining that fails from reading a codeword are beyond an ECC tolerance (e.g., a tolerance threshold). In one example of a codeword (CW) read from a chalcogenide memory array, if a memory device is implementing bipolar read, bits of different states can have been affected by different drift times following prior programming of the bits.

It is difficult to know and/or predict an average threshold voltage for a distribution of data cells to be read (e.g., data cells in a codeword). When reading a codeword to determine data cells in, for example, a logic 1 or SET, an initial read voltage is selected that is sufficiently low so that data cells in a logic 0 or RESET state are not inadvertently disturbed (e.g., read disturb due to a large number of reads of adjacent memory cells) and then gradually increased higher in small steps as needed to complete a read operation. However, if the initial read voltage is selected to be too low, then gradual stepping of the read voltage to an adequately high voltage can require significant time. This can significantly increase the time required for read operations, and thus can reduce the read bandwidth for a memory device.

In some cases, a threshold voltage distribution of data cells (e.g., codewords) can be tracked using a set of known pattern (KP) cells. For example, KP cells or bits are used to track a distribution, and the KP bits are read in parallel during a read of the data cells. In one example, each codeword has additional KP bits, and the KP bits are programmed to logic 1 at the same time as the codeword is written. The KP bits may be a few cells (e.g., 8 cells). Also, the KP bits may be specific for each logic state (e.g., KP0 bits for level 0, and KP1 bits for level 1). During a read algorithm, the position of the data cell distribution can be determined by moving the read voltage step by step or with a ramp. However, when using KP bits, in some cases the time required to select a read voltage may be significant. Thus, it is desirable to further reduce the length of time required for finding a suitable read voltage to read codewords or other data cells.

To address the above and other technical problems, a memory array in a memory device uses multiple groups of pattern cells to select an initial read voltage. The pattern cells are all programmed to only a logic 1 (low threshold voltage) state so that higher voltages can be applied to the pattern cells without causing read disturb or other disturbances in any cells in a logic 0 (high threshold voltage) state. By applying the higher voltages in parallel to the groups of pattern cells, data regarding a threshold voltage distribution for data cells (e.g., in a codeword) can more quickly be obtained so that an appropriate initial read voltage can be selected to read the data cells.

In one embodiment, a memory device includes a memory array having pattern cells (e.g., in 4 groups) and data cells. The pattern cells store only a first logic state (e.g. 1), and the data cells are configured to store the first logic state or a second logic state (e.g., 1 or 0). The memory device includes bias circuitry to apply voltages (e.g., a ramp or steps of increasing magnitude) to the pattern cells and data cells, and sensing circuitry to read the pattern cells and data cells.

The memory device further includes a controller to apply, using the bias circuitry, first voltages to the pattern cells (e.g., different voltages of increasing magnitude are applied to each of the 4 groups of pattern cells). The controller determines, using the sensing circuitry, that at least a portion of the pattern cells switch (e.g., group 1 does not switch, but groups 2, 3, 4 switch). The controller selects, based on the portion of the pattern cells that switch, a second voltage (e.g., the voltage that was applied to the first group to switch as voltage is increased, which is group 2). Then, the controller applies, using the bias circuitry, the second voltage to the data cells (e.g., to read a codeword on a common wordline of the memory array).

In one embodiment, a memory array has groups of extra cells used as pattern cells. The pattern cells are written to 1, and biased with a higher voltage than for data cells of the array. Biasing the pattern cells provides information on the average threshold of a codeword distribution (e.g., a codeword being currently read in a read operation). The codeword is read by biasing the memory array with the voltage at which the first group of the pattern cells switches. This reduces the read length because the read voltage for reading data cells can be jumped to a higher voltage. After jumping to this higher voltage, the read continues with smaller increments or steps of the read voltage (e.g., for more precise control of read voltage).

In one embodiment, each of several groups g(i) of pattern cells is biased with a voltage v(gi). A sense response from reading the cells of each group is observed to determine those of the groups that switched (e.g., one group, a portion of the groups switch, or all groups). Based on the groups that switched, a data codeword is biased, for example, with the voltage corresponding to the first of the groups that switched. If the read is not successfully completed by applying this voltage, then the read operation continues by biasing the codeword with extra read voltage steps (e.g., a sequence of small steps) to increase the accuracy of the read.

In one embodiment, groups g(i) of pattern cells are biased with different voltages v(gi). An estimate of the average threshold voltage of the 1 cell distribution for a codeword is determined by observing which of the groups g(i) switch in response to the biasing. In one example, only group g4 switches, so the estimate is v(g4).

In another example, the estimate can be based on characteristics observed for multiple groups that switch. For example, groups 2, 3, 4 may all switch. Data from sensing pattern cells from any or all of groups 2, 3, 4, can be inputs to a function (e.g., a mathematical or other function) used to select a read voltage. In one example, the function is a computer model (e.g., artificial neural network). The selected read voltage is used to choose how to bias the data cells when reading a codeword (e.g., one or more read voltages can be selected) (e.g., a read voltage profile can be determined).

Various advantages are provided by embodiments described herein. In one advantage, the use of higher voltages (e.g., voltages higher than for data cells) to read multiple groups of pattern cells reduces the time required for read operations. More quickly and/or accurately determining an initial read voltage reduces the number of voltage steps required for a read operation.

FIG. 1 shows a memory device 101 that uses multiple patterns to select a voltage for performing read operations, in accordance with some embodiments. In one example, the multiple patterns are groups of pattern cells. Memory device 101 includes a memory array 102 having data cells 110 and pattern cells 112. The pattern cells 112 are organized into various groups g1, g2, g3, g4, as illustrated. Each of the groups includes memory cells of the same type as in other groups. Also, the memory cells in the groups are of the same type as the memory cells that store data (e.g., data cells 110). In one example, each of the groups includes a relatively small number of cells such as 5-8 cells as compared to the number of cells (e.g., 128 or 256) that provides a codeword.

Each of the pattern cells 112 is written or programmed to store only a first logic state that corresponds to a low voltage threshold magnitude. In one example, the first logic state is a logic one (1) or SET state for a positive polarity. Data cells 110 store data (e.g., user data for host device 126) in either the first logic state or a second logic state. The second logic state corresponds to a high voltage threshold magnitude. In one example, the second logic state is a logic zero (0) or RESET state for a positive polarity.

In one embodiment, pattern cells 112 are configured so that the operating history for pattern cells 112 is the same as or similar to data cells 110. In one example, each set of groups of pattern cells 112 is configured to correspond to a respective set of data cells 110. In one example, pattern cells 112 are in a same location of memory array 102 as data cells 110. In one example, the same location is the same tile or partition of memory array 102. In one example, the same location is a location on a same access line as data cells 110. In one example, the same location is on the same wordline as used to select data cells 110.

When performing a read operation, bias circuitry 124 applies voltages to pattern cells 112. In one example, bias circuitry 124 includes wordline and bitline drivers (not shown) to bias wordlines and bitlines of memory array 102.

Memory controller 120 determines which of the groups of pattern cells 112 switch. In one example, controller 120 determines that a group switches when a number of memory cells in the group that switch (e.g., threshold or snap) is greater than a threshold. In one example, the threshold is 50% or more of the memory cells in a group switching. Counters 104 can be used to count the number of memory cells that switch in a group of pattern cells 112 and/or a number of data cells 110 that switch when being read.

Sensing circuitry 122 is used to read pattern cells 112 and data cells 110. In one example, sensing circuitry 122 includes sense amplifiers for sensing a characteristic associated with memory cells of the memory array 102. The characteristic can be, for example, a voltage and/or current associated with a selected memory cell.

Controller 120 causes bias circuitry 124 to apply voltages to each group of the pattern cells 112. The voltages are applied in parallel so that each group can be sensed by sensing circuitry 122 simultaneously. In one example, the voltages are increasing magnitudes of voltage values (e.g., v(g1) applied to group g1, v(g2) applied to group g2, v(g3) applied to group g3, v(g4) applied to group g4) (e.g., +2, +2.5, +3, +3.5, +4, +4.5, +5 V) separated by steps (e.g., 0.5 V steps). In one example, the voltages are separated by equal steps. In one example, the voltages are separated by steps that vary in size. The variation in the size of the steps can be determined by controller 120 based on an operating context of memory device 101, such as an error rate or other characteristic associated with prior reading data cells of memory array 102.

After the voltages are applied to pattern cells 112, controller 120 determines which of the groups switch. Controller 120 uses data or signals from sensing circuitry 122 that indicate which pattern cells 112 have switched.

Based on determining which groups of pattern cells 112 switch, controller 120 determines an initial read voltage to use when reading (e.g., user data) from data cells 110. In one example, bias circuitry 124 applies this initial read voltage to data cells 110 when starting a read. In one example, bias circuitry 124 jumps to this initial read voltage during a read of data cells 110.

Memory controller 120 includes one or more processing devices 116 and memory 118. In one example, memory 118 stores firmware executed by processing device 116 to select and apply the read voltages.

Memory controller 120 can use bias circuitry 124 to generate voltages for applying read and other voltages (e.g., initial read and read retry). Bias circuitry 124 can also generate voltages for applying write voltages to data cells 110, pattern cells 112 as part of programming operations. Bias circuitry 124 may be used to generate read voltages for read operations performed on memory array 102 (e.g., in response to a read command from host device 126).

Sensing circuitry 122 can be used to sense a state of each memory cell in memory array 102. In one example, sensing circuitry 122 includes sense amplifiers used to detect a current caused by applying various voltages to memory cells in memory array 102. In one example, bias circuitry 124 applies a read voltage to data cells 110 or pattern cells 112. Sensing circuitry 122 senses a current associated with each of the data cells 110 or pattern cells 112 caused by applying the read voltage.

In one example, if sensing circuitry 122 determines that the current for a memory cell is greater than a fixed threshold (e.g., a predetermined level of current), then memory controller 120 determines that the memory cell has switched (e.g., snapped).

In one embodiment, memory controller 120 receives a write command from a host device 126. The write command is accompanied by data (e.g., user data of a user of host device 126) to be written to memory array 102. In response to receiving the write command, controller 120 initiates a programming operation.

In one embodiment, controller 120 uses one of counters 104 to count the number of data or pattern cells that snap as a read voltage is applied. Data stored in counters 104 can be used as part of an evaluation when determining a read voltage to apply. This stored data can optionally be used in combination with error results from ECC of read data when selecting the read voltage (e.g., a read retry voltage). For example, the stored data and/or ECC results can be provided as inputs to a machine learning model (e.g., artificial neural network) to provide an output of a voltage to use for read retry.

In one example, controller 120 may use write voltages (e.g., write pulses) to write a logic state to a memory cell, such as data cell 110 or pattern cell 112 during a write or programming operation. The write pulses may be applied by providing a first voltage to a bitline and providing a second voltage to a wordline to select the memory cell. Circuits coupled to access lines to which memory cells may be coupled may be used to provide the write voltages (e.g., access line drivers included in decoder circuits). The circuits may be controlled by internal control signals provided by a control logic (e.g., controller 120). The resulting voltage applied to the memory cell is the difference between the first and second voltages. The write pulses may be the same duration as read pulses in some embodiments. In some embodiments the duration is 10-50 ns. In some embodiments, the duration is 1-100 ns. In some embodiments, the duration is 1 ns to 1 microsecond. Writing to the memory cell may take the same time as reading the memory cell in some embodiments.

In one example, the polarity of the read or write pulses may be either a first polarity or a second polarity. For example, a write pulse may apply a voltage to a memory cell in a first polarity (e.g., bitline at 6V and wordline at 0V).

In one example, circuits coupled to access lines to which memory cells may be coupled are used to provide read pulses (e.g., access line drivers included in decoder circuits). The circuits may be controlled by internal control signals provided by a control logic (e.g., controller 120). A read voltage or pulse may be a voltage applied to a memory cell fora period of time (e.g., 10-50 ns, 1-100 ns, 1 ns to 1 microsecond). In some embodiments, the read pulse may be a square pulse. In some embodiments, the read pulse may be a ramp, that is, a linearly-increasing voltage may be applied across the memory cell.

In one example, after being accessed (e.g., selected), a memory cell may be read, or sensed, by a sense component (e.g., sensing circuitry 122) to determine the stored state of the memory cell. For example, a voltage may be applied to the memory cell (using a wordline and bitline) and the presence of a resulting current may depend on the applied voltage and the threshold voltage of the memory cell. In some cases, more than one voltage may be applied. Additionally, if an applied voltage does not result in current flow, other voltages may be applied until a current is detected by the sense component. By assessing the voltage that resulted in current flow, the stored logic state of the memory cell may be determined. In some cases, the voltage may be ramped up in magnitude until a current flow is detected (e.g., a memory cell turns on, switches on, conducts current, or becomes activated). In other cases, predetermined voltages may be applied sequentially until a current is detected. Likewise, a current may be applied to a memory cell, and the magnitude of the voltage to create the current may depend on the electrical resistance or the threshold voltage of the memory cell.

In some cases, the memory cell (e.g., a PCM cell) includes a material that changes its crystallographic configuration (e.g., between a crystalline phase and an amorphous phase), which in turn, determines a threshold voltage of the memory cell to store information. In other cases, the memory cell includes a material that remains in a crystallographic configuration (e.g., an amorphous phase) that may exhibit variable threshold voltages to store information.

The sense component may include various transistors or amplifiers in order to detect and amplify a difference in the signals. The detected logic state of the memory cell may then be output through a column decoder as output. In some cases, the sense component may be part of a column decoder or a row decoder.

Figure 2:
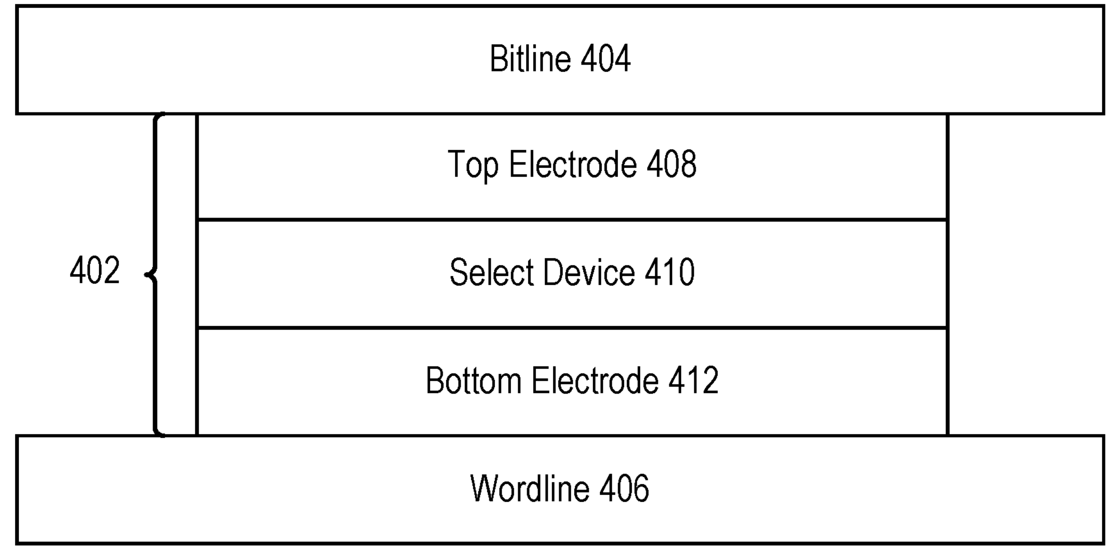
FIG. 2 shows an example of a memory cell that includes a select device, in accordance with some embodiments.

FIG. 2 shows an example of a memory cell 402 that includes a select device, in accordance with some embodiments. In one example, select device 410 includes a chalcogenide. Memory cell 402 is an example of data cells 110 and/or pattern cells 112.

Top electrode 408 conductively connects select device 410 to bitline 404, and bottom electrode 412 conductively connects select device 410 to wordline 406. In one example, electrodes 408, 412 are formed of a carbon material.

In one example, select device 410 includes a chalcogenide (e.g., chalcogenide material and/or chalcogenide alloy). Threshold voltage properties of the select device may be based on the voltage polarities applied to the memory cell.

In one example, a logic state may be written to memory cell 402, which may correspond to one or more bits of data. A logic state may be read from or written to the memory cell by applying voltages of different polarities at different voltage and/or current magnitudes. The reading and writing protocols may take advantage of different threshold voltages of the select device that result from the different polarities. In other words, when the memory cell is a self-selecting memory cell implemented using a selector/memory device, the select device 410 may be used as both a selecting element and a storage element of the cell 402.

Figures 3, 4:
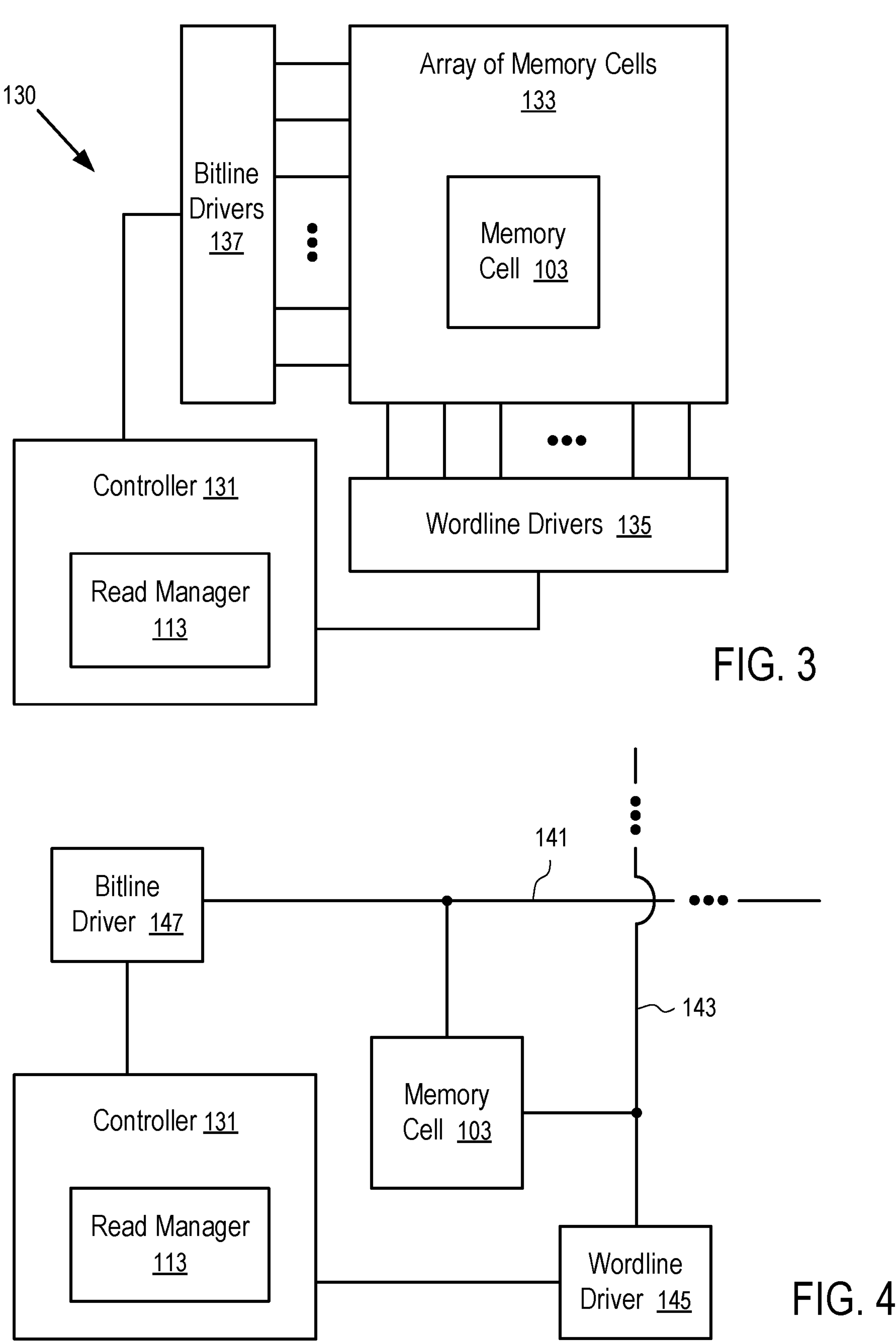
FIG. 3 shows a memory device configured with a read manager to select read voltages according to one embodiment.
FIG. 4 shows a memory cell with a bitline driver and a wordline driver configured to apply voltage pulses according to one embodiment.

FIG. 3 shows a memory device 130 configured with a read manager 113 according to one embodiment. Memory device 130 is an example of memory device 101. In FIG. 3, the memory device 130 includes an array 133 of memory cells, such as a memory cell 103. Memory cell 103 is an example of data cell 110, or pattern cell 112.

In one example, an array 133 can be referred to as a tile; and a memory device (e.g., 130) can have one or more tiles. Different tiles can be operated in parallel in a memory device (e.g., 130).

For example, the memory device 130 illustrated in FIG. 3 can have a cross-point memory having at least the array 133 of memory cells (e.g., 103). In another example, the memory device 130 illustrated in FIG. 3 can have a 3D vertical architecture having at least the array 133 of memory cells (e.g., 103).

In some implementations, the cross point memory uses a memory cell 103 that has an element (e.g., a sole element) acting both as a selector device and a memory device. For example, the memory cell 103 can use a single piece of alloy with variable threshold capability. The read/write operations of such a memory cell 103 can be based on thresholding the memory cell 103 while inhibiting other cells in sub-threshold bias, in a way similar to the read/write operations for a memory cell having a first element acting as a selector device and a second element acting as a phase-change memory device that are stacked together as a column. A selector device usable to store information can be referred to as a selector/memory device.

The memory device 130 of FIG. 3 includes a controller 131 that operates bitline drivers 137 and wordline drivers 135 to access the individual memory cells (e.g., 103) in the array 133.

For example, each memory cell (e.g., 103) in the array 133 can be accessed via voltages driven by a pair of a bitline driver 147 and a wordline driver 145, as illustrated in FIG. 4.

The controller 131 includes a read manager 113 configured to implement a process that determines one or more read voltages for reading data cells based on data obtained from applying voltages to two or more groups of pattern cells. The read manager 113 can be implemented, for example, via logic circuits and/or microcode/instructions. For example, during a read retry, the read manager 113 uses a read voltage having a magnitude larger than a read voltage previously used to read the memory cell (e.g., 103). The read voltage with the increased magnitude applied to the memory cell (e.g., 103) can be sufficient to obtain the error free data from the memory cell (e.g., 103).

FIG. 4 shows a memory cell 103 with a bitline driver 147 and a wordline driver 145 configured to apply voltages (e.g., ramps or steps) according to one embodiment. For example, the memory cell 103 can be a typical memory cell 103 in the memory cell array 133 of FIG. 3.

The bitline driver 147 and the wordline driver 145 of FIG. 4 are controlled by the read manager 113 of the controller 131 to selectively apply one or more voltages to the memory cell 103. The bitline driver 147 and the wordline driver 145 can apply voltages of different polarities on the memory cell 103.

For example, in applying one polarity of voltage (e.g., positive polarity), the bitline driver 147 drives a positive voltage relative to the ground on a bitline 141 connected to a row of memory cells in the array 133; and the wordline driver 145 drives a negative voltage relative to the ground on a wordline 143 connected to a column of memory cells in the array 133.

In applying the opposite polarity of voltage (e.g., negative polarity), the bitline driver 147 drives a negative voltage on the bitline 141; and the wordline driver 145 drives a positive voltage on the wordline 143.

The memory cell 103 is in both the row connected to the bitline 141 and the column connected to the wordline 143. Thus, the memory cell 103 is subjected to the voltage difference between the voltage driven by the bitline driver 147 on the bitline 141 and the voltage driven by the wordline driver 145 on the wordline 143.

In general, when the voltage driven by the bitline driver 147 is higher than the voltage driven by the wordline driver 145, the memory cell 103 is subjected to a voltage in one polarity (e.g., positive polarity); and when the voltage driven by the bitline driver 147 is lower than the voltage driven by the wordline driver 145, the memory cell 103 is subjected to a voltage in the opposite polarity (e.g., negative polarity).

In some implementations, the memory cell 103 is a self-selecting memory cell implemented using a selector/memory device. The selector/memory device has a chalcogenide (e.g., chalcogenide material and/or chalcogenide alloy). For example, the chalcogenide material can include a chalcogenide glass such as, for example, an alloy of selenium (Se), tellurium (Te), arsenic (As), antimony (Sb), carbon (C), germanium (Ge), and silicon (Si). A chalcogenide material can primarily have selenium (Se), arsenic (As), and germanium (Ge) and be referred to as SAG-alloy. SAG-alloy can include silicon (Si) and be referred to as SiSAG-alloy. In some embodiments, the chalcogenide glass can include additional elements such as hydrogen (H), oxygen (O), nitrogen (N), chlorine (CI), or fluorine (F), each in atomic or molecular forms.

The selector/memory device has a top side and a bottom side. A top electrode is formed on the top side of the selector/memory device for connecting to a bitline 141; and a bottom electrode is formed on the bottom side of the selector/memory device for connecting to a wordline 143. For example, the top and bottom electrodes can be formed of a carbon material. For example, a chalcogenide material of the memory cell 103 can take the form of a crystalline atomic configuration or an amorphous atomic configuration. The threshold voltage of the memory cell 103 can be dependent on the ratio of the material in the crystalline configuration and the material of the amorphous configuration in the memory cell 103. The ratio can change under various conditions (e.g., having currents of different magnitudes and directions going through the memory cell 103).

A self-selecting memory cell 103, having a selector/memory device, can be programmed to have a threshold voltage window. The threshold voltage window can be created by applying programming pulses with opposite polarity to the selector/memory device. For example, the memory cell 103 can be biased to have a positive voltage difference between two sides of the selector/memory device and alternatively, or to have a negative voltage difference between the same two sides of the selector/memory device. When the positive voltage difference is considered in positive polarity, the negative voltage difference is considered in negative polarity that is opposite to the positive polarity. Reading can be performed with a given/fixed polarity. When programmed, the memory cell has a low threshold (e.g., lower than the cell that has been reset, or a cell that has been programmed to have a high threshold), such that during a read operation, the read voltage can cause a programmed cell to snap and thus become conductive while a reset cell remains non-conductive.

For example, to program the voltage threshold of the memory cell 103, the bitline driver 147 and the wordline driver 145 can drive a pulse of voltage onto the memory cell 103 in one polarity (e.g., positive polarity) to snap the memory cell 103 such that the memory cell 103 is in a conductive state. While the memory cell 103 is conductive, the bitline driver 147 and the wordline driver 145 continue driving the programming pulse to change the threshold voltage of the memory cell 103 towards a voltage region that represents the data or bit value(s) to be stored in the memory cell 103.

The controller 131 can be configured in an integrated circuit having a plurality of decks of memory cells. Each deck can be sandwiched between a layer of bitlines, a layer of wordlines; and the memory cells in the deck can be arranged in an array 133. A deck can have one or more arrays or tiles. Adjacent decks of memory cells may share a layer of bitlines (e.g., 141) or a layer of wordlines (e.g., 143). Bitlines are arranged to run in parallel in their layer in one direction; and the wordlines are arranged to run in parallel in their layer in another direction orthogonal to the direction of the bitlines. Each of the bitlines is connected to a row of memory cells in the array; and each of the wordlines is connected to a column of memory cells in the array. Bitline drivers 137 are connected to bitlines in the decks; and wordline drivers 135 are connected to wordlines in the decks. Thus, a typical memory cell 103 is connected to a bitline driver 147 and a wordline driver 145.

The threshold voltage of a typically memory cell 103 is configured to be sufficiently high such that when only one of its bitline driver 147 and wordline driver 145 drives a voltage in either polarity while the other voltage driver holds the respective line to the ground, the magnitude of the voltage applied across the memory cell 103 is insufficient to cause the memory cell 103 to become conductive. Thus, addressing the memory cell 103 can be performed via both of its bitline driver 147 and wordline driver 145 driving a voltage in opposite polarity relative to the ground for operating/selecting the memory cell 103. Other memory cells connected to the same wordline driver 145 can be de-selected by their respective bitline drivers holding the respective bitlines to the ground; and other memory cells connected to the same bitline driver can be de-selected by their respective wordline drives holding the respective wordlines to the ground.

A group of memory cells (e.g., 103) connected to a common wordline driver 145 can be selected for parallel operation by their respective bitline drivers (e.g., 147)

driving up the magnitude of voltages in one polarity while the wordline driver 145 is also driving up the magnitude of a voltage in the opposite polarity. Similarly, a group of memory cells connected to a common bitline driver 147 can be selected for parallel operation by their respective wordline drivers (e.g., 145) driving voltages in one polarity while the bitline driver 147 is also driving a voltage in the opposite polarity.

At least some examples are disclosed herein in reference to a cross-point memory having self-selecting memory cells. Other types of memory cells and/or memory can also be used. For example, memory cells each having a selector device and a phase-change memory device and/or flash memory cells can also be used in at least some embodiments. Additionally or alternatively, the memory can have a different architecture, such as a 3D vertical architecture.

Figure 5:
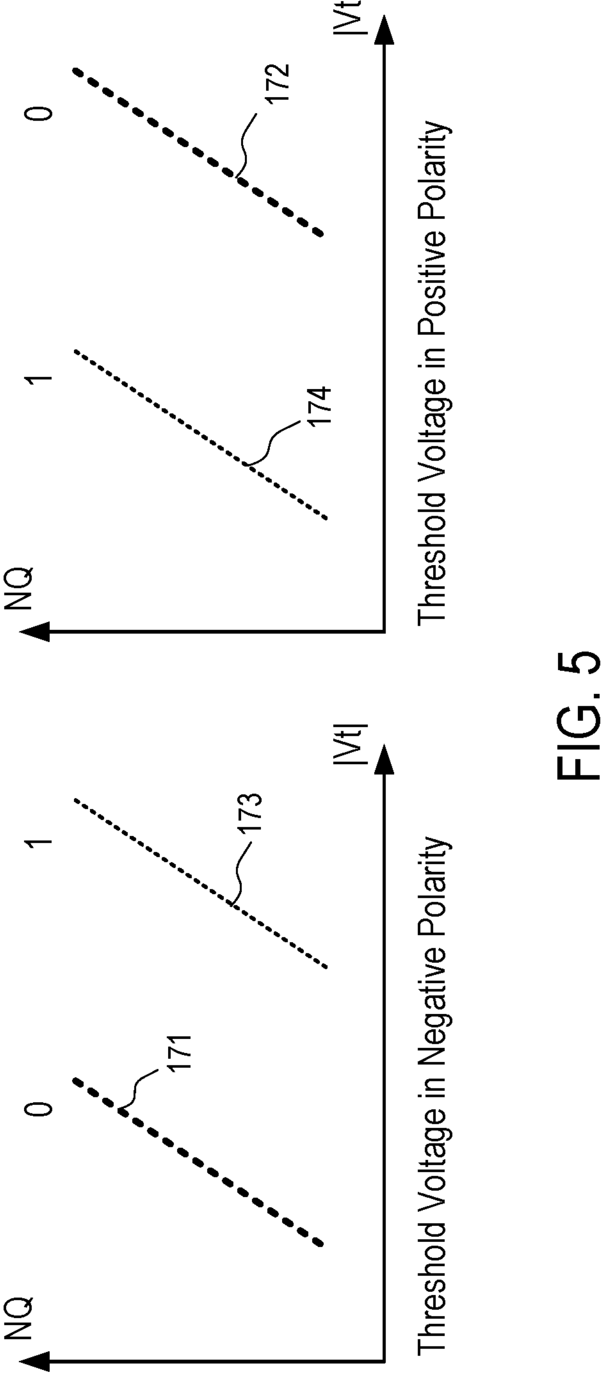
FIG. 5 shows an exemplary normal quantile (NQ) plot representing the statistical distributions of threshold voltages of memory cells.

FIG. 5 shows an exemplary normal quantile (NQ) plot representing the statistical distributions (e.g., 171-174) of threshold voltages of memory cells. In one example, the memory cells are data cells 110, and/or pattern cells 112. When a probability distribution (e.g., 171) of threshold voltages programmed in a region is a normal distribution (also known as Gaussian distribution), its normal quantile (NQ) plot is seen as aligned on a straight line (e.g., distribution 171).

A self-selecting memory cell (e.g., 103) can have a threshold voltage in negative polarity and a threshold voltage in positive polarity. When a voltage applied on the memory cell 103 in either polarity is increased in magnitude up to its threshold voltage in the corresponding polarity, the memory cell (e.g., 103) switches (e.g., snaps) from a non-conductive state to a conductive state.

The threshold voltage of a memory cell 103 in negative polarity and the threshold voltage of the memory cell 103 in positive polarity can have different magnitudes. Memory cells programmed to have large magnitudes in threshold voltages in positive polarity can have small magnitudes in threshold voltages in negative polarity; and memory cells programmed to have small magnitudes in threshold voltages in positive polarity can have large magnitudes in threshold voltages in negative polarity.

For example, a memory cell can be programmed to have a small magnitude in threshold voltage according to distribution 174 in the positive polarity to represent a value (e.g., one); and as a result, its threshold voltage has a large magnitude according to distribution 173 in the negative polarity to represent the same value (e.g., one). Alternatively, the memory cell can be programmed to have a large magnitude in threshold voltage according to distribution 172 in the positive polarity to represent another value (e.g., zero); and as a result, its threshold voltage has a smaller magnitude according to distribution 171 in the negative polarity to represent the same value (e.g., zero).

Thus, to determine whether a memory cell 103 is storing the one value (e.g., one) or the other value (e.g., zero), the read manager 113 can read the memory cell 103 in either the positive polarity or the negative polarity. If the threshold voltage of the memory cell 103 has a large magnitude according to distribution 172 in the positive polarity, it stores the other value (e.g., zero); otherwise, it stores the one value (e.g., one). Similarly, if the threshold voltage of the memory cell 103 has a large magnitude according to distribution 173 in the negative polarity, it stores the one value (e.g., one); otherwise, it stores the other value (e.g., zero).

The threshold voltage distributions of memory cells may change after a read. For example, in the positive polarity, a read can cause the high magnitude distribution 172 to shift downward, and/or the low magnitude distribution 174 to shift downward.

Similarly, in negative polarity, the read can cause the high magnitude distribution 173 to shift downward, and/or the low magnitude distribution 171 to shift downward.

Figure 6:
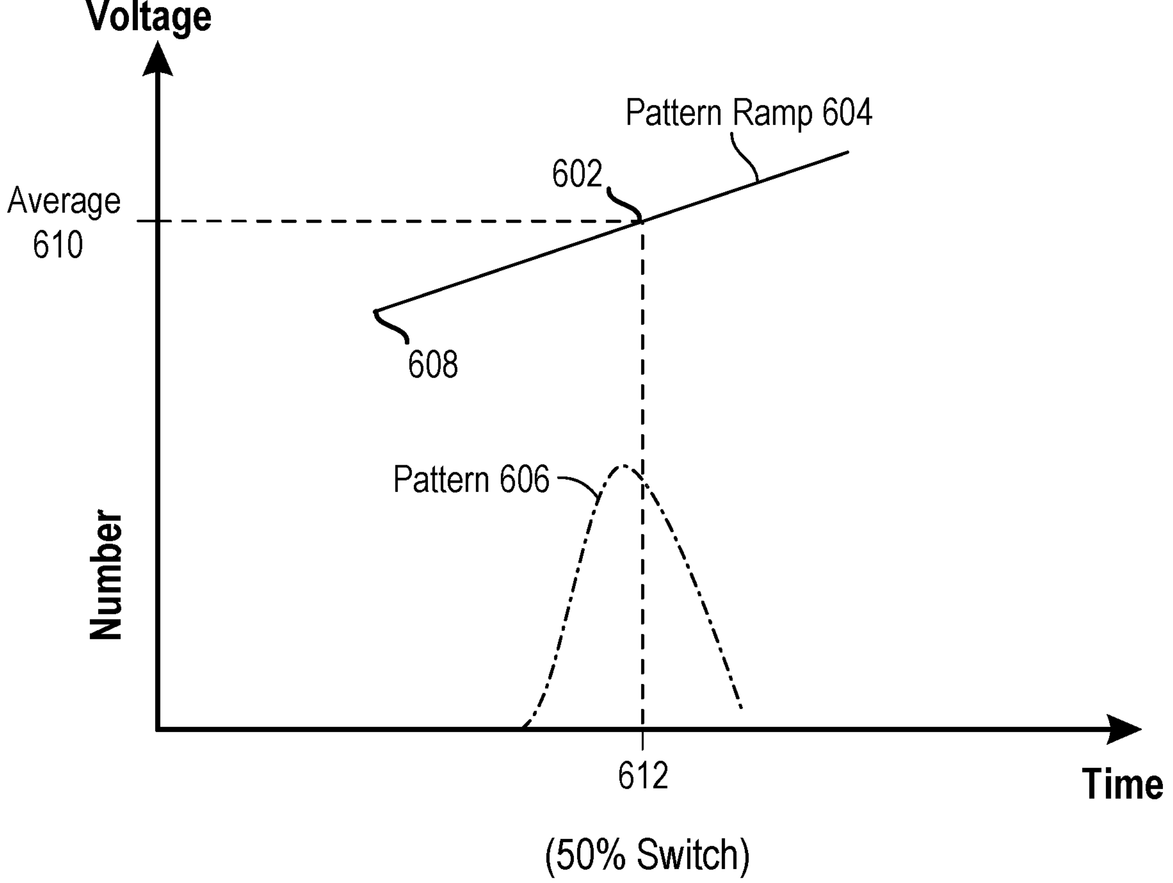
FIG. 6 shows an exemplary pattern cell distribution for a pattern ramp applied to a pattern in a memory array, in accordance with some embodiments.

FIG. 6 shows an exemplary pattern cell distribution 606 for a pattern ramp 604 applied to a pattern in a memory array, in accordance with some embodiments. In one example, the memory array is memory array 102. In one example, pattern ramp 604 is applied in magnitudes of different voltages to each of groups g1, g2, g3, g4 of pattern cells 112.

Pattern cell distribution 606 illustrates a number (vertical axis) of memory cells that switch over time (horizontal axis) as pattern ramp 604 is applied to a group of pattern cells. In one example, pattern ramp 604 (the vertical axis also shows the voltage of ramp 604) is applied starting at an initial voltage 608 and increasing in magnitude to point 602 which corresponds to a time 612 at which 50% of the pattern cells have switched.

A controller determines an average threshold voltage 610 based on the switching of at least 50% of the pattern cells. Average threshold voltage 610 is used by the controller as a proxy for, or prediction of, the 1 cell threshold voltage distribution of data cells to be read. An initial read voltage for reading the data cells is selected based on average threshold voltage 610.

In one example, the initial read voltage is determined by adding an additional value to average threshold voltage 610. In one example, the additional value is one or two standard deviations ($\sigma$ or $2\sigma$) of a threshold voltage distribution for the data cells. In one example, the standard deviation of the threshold voltage distribution for the data cells is determined using prior data collected by the controller from operation of the memory device having the data cells.

In one embodiment, a group of pattern cells switching implies that its biasing voltage is higher than or equal to the average of the 1 cell distribution of a codeword. Thus, it is possible to know the average of the 1 cell distribution by observing the switching of the pattern cells.

Figure 7:
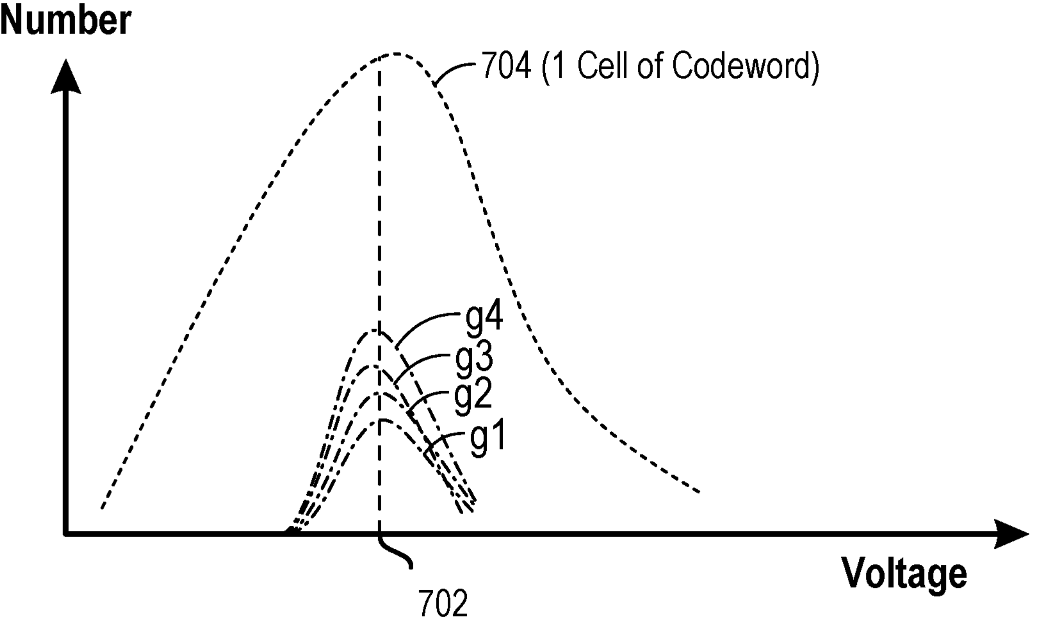
FIG. 7 shows exemplary pattern cell distributions relative to a data cell distribution, in accordance with some embodiments.

FIG. 7 shows exemplary pattern cell distributions (e.g., for groups g1, g2, g3, g4) relative to a data cell (logic 1) distribution 704, in accordance with some embodiments. In one embodiment, a multi-pattern structure is used (e.g., 4 groups of pattern cells of the same type and same number of cells in each group). In one example, there are 4 groups g1, g2, g3, g4 that share the same average threshold voltage 702 with the logic 1 cell distribution 704 of the codeword.

Figure 8:
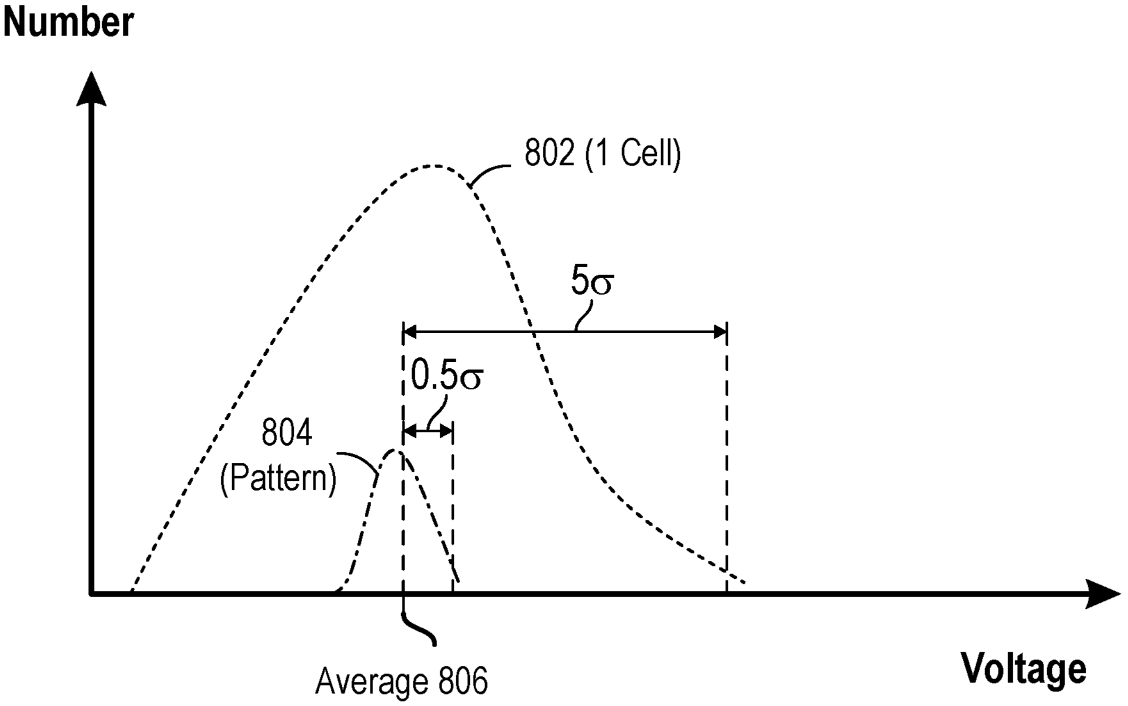
FIG. 8 shows exemplary standard deviation ranges for pattern cell and data cell distributions, in accordance with some embodiments.

FIG. 8 shows exemplary standard deviation ranges for pattern cell and data cell distributions, in accordance with some embodiments. The ranges correspond to left and right tails of the distributions.

In one embodiment, each group of pattern cells has a distribution that is narrower than a distribution for data cells (e.g., data cells storing a codeword). However, the average of the distribution for each group of pattern cells is the same or within a small tolerance of the distribution for the data cells. In one example, the average threshold voltage for the pattern cell distribution is within 1-10% of the average threshold voltage for the data cell distribution.

As illustrated, distribution 804 for pattern cells has an average threshold voltage 806. Distribution 802 for data cells has an average threshold voltage that is the same as or within a small tolerance (e.g., within 5%) of average threshold voltage 806.

Distribution 802 has a standard deviation σ. In one example, the standard deviation is determined based on experimental data collected for data cells of the same type. In one example, the standard deviation is determined based on operating data collected by a controller during operation of a memory device.

Distribution 802 has a right tail extending a range 5σ. Distribution 804 has a right tail extending a range 0.5σ. In one example, the left tails of distributions 802, 804 have a similar shape as for the corresponding right tail.

Figure 9:
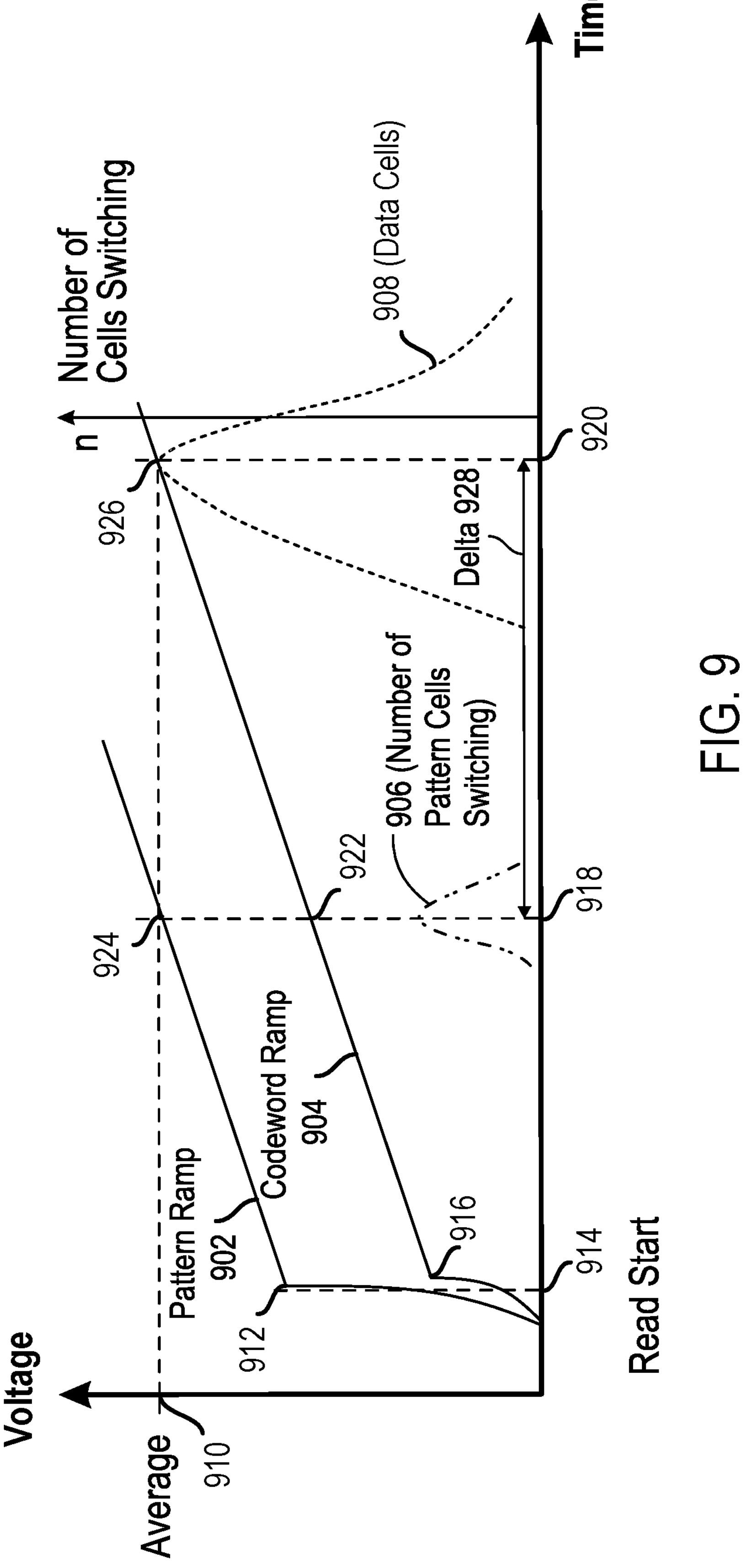
FIG. 9 shows a pattern ramp and a codeword ramp that are applied during a read operation, in accordance with some embodiments.

FIG. 9 shows a pattern ramp 902 and a codeword ramp 904 that are applied during a read operation, in accordance with some embodiments. In one example, the read operation begins at time 914 (read start) in response to a read command received by memory device 101 from host device 126.

Pattern ramp 902 is used to apply voltages to a first group of pattern cells. The first group of pattern cells has a distribution 906, which indicates a number of pattern cells switching with increasing time as pattern ramp 902 is applied. Ramp 902 starts at initial voltage 912 at time 914 and increases in magnitude with increasing time. At point 924 on pattern ramp 902, a determination is made (e.g., by a controller) at time 918 that the first group of pattern cells has switched. In one example, the first group of pattern cells is considered to have switched when 50% or more of the pattern cells inside the first group are determined (by using one or more sense amplifiers) to threshold or snap.

Point 924 corresponds to voltage 910, which is considered to correspond to an average threshold voltage of the first group of pattern cells, as illustrated in distribution 906. As described above, average threshold voltage 910 can be used by a controller to select a read voltage to apply for reading data cells.

Codeword ramp 904 is used to apply voltages to data cells (e.g., corresponding to a codeword). Ramp 904 starts at initial voltage 916 and increases in magnitude with increasing time. At time 918, the voltage of codeword ramp 904 at point 922 is at a lower magnitude then voltage 910 corresponding to point 924. The voltage bias applied to the first group of pattern cells can be a higher voltage than the voltage applied to the data cells because of the absence of read reset disturb concerns for the pattern cells. This is because the first group of pattern cells only contains cells programmed to a logic 1 (set state).

By applying a higher voltage to the pattern cells than to the data cells (e.g., from time 914 to time 918 as illustrated), the pattern cells will switch before the data cells. This enables using data obtained regarding voltages at which the pattern cells switch to select a read voltage(s) to use for reading the data cells.

Codeword ramp 904 continues to increase in voltage after time 918. Based on the determination of average threshold voltage 910 above, a controller increases the voltage of ramp 904 to point 926, which corresponds to threshold voltage 910. Point 926 corresponds to time 920, which is a delta time 928 later than time 918. At point 926, a number of data cells switches as illustrated by distribution 908. The voltage of ramp 904 is further increased until a sufficient number of data cells of distribution 908 have switched. In one example, the number of data cells switching is sufficient when an error rate associated with reading the data cells is below a threshold. In one example, the number of data cells switching is sufficient when a codeword can be fully decoded (e.g., with or without error correction decoding).

In one embodiment, although not illustrated, additional pattern ramps (at incrementally higher voltages) are applied in parallel to other groups of pattern cells. In one example, the first group above is group g1 to which ramp 902 is applied, and other ramps are applied in parallel to groups g2, g3, g4. Thus, at time 918, for example, four different voltages of increasing magnitudes are applied to four groups of pattern cells. A controller determines which of these groups switch, and at what times and voltages the groups switch. This data regarding switching of pattern cells can be used by the controller as inputs to a function (e.g., as described above) to select one or more read voltages to apply to data cells.

Figure 10:
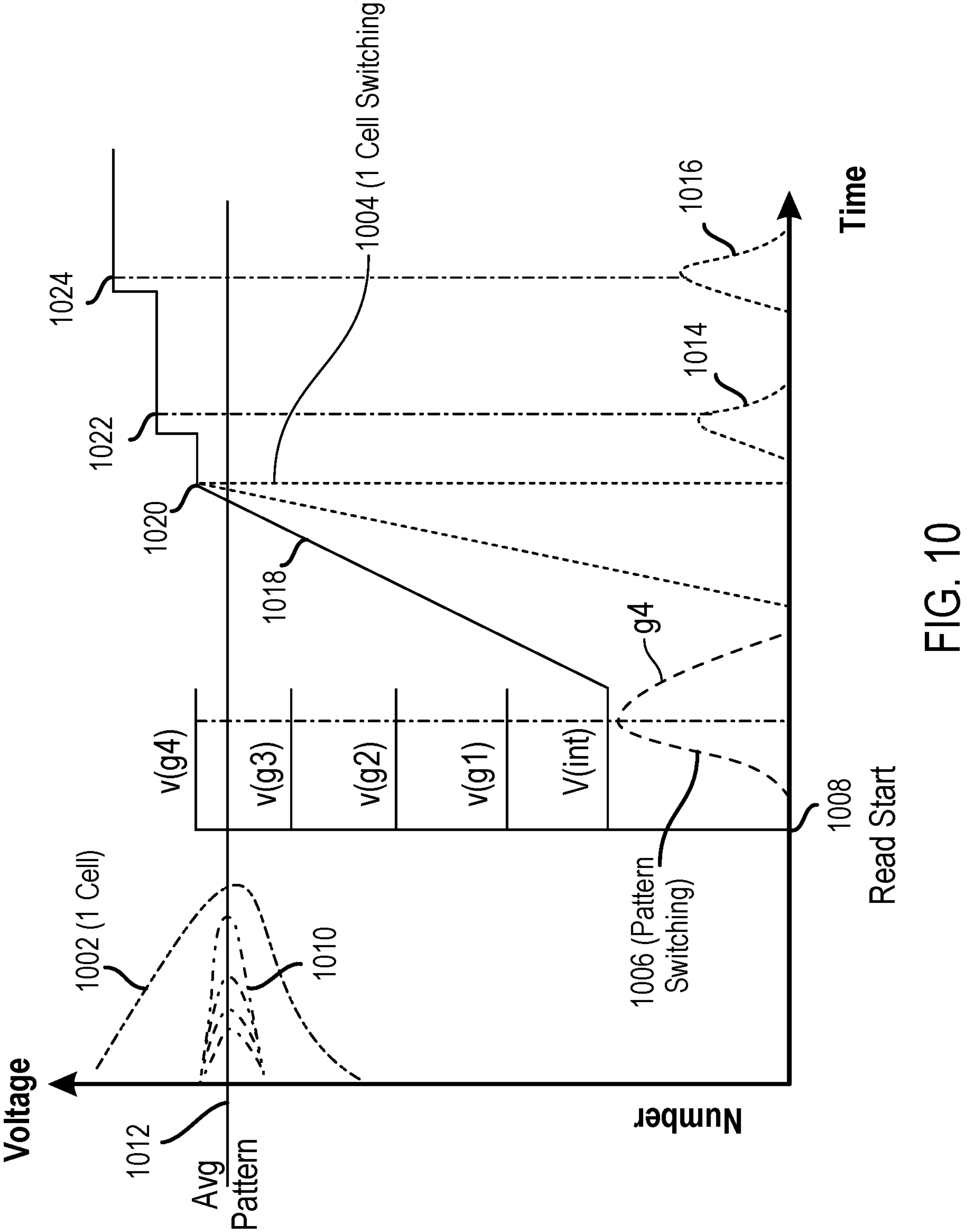
FIG. 10 shows a read voltage profile applied to data cells based on results from reading multiple groups of pattern cells, in accordance with some embodiments.

FIG. 10 shows a read voltage profile 1018 applied to data cells based on results from reading multiple groups of pattern cells, in accordance with some embodiments. In one example, read voltage profile 1018 is applied as part of a read operation that starts at time 1008.

In one example, the pattern cells are pattern cells 112 and the data cells are data cells 110. In one example, pattern ramp 902 is applied to pattern cells 112. In one example, read voltage profile 1018 is codeword ramp 904. In one example, one or more voltages of read voltage profile 1018 are selected based on results from applying one or more pattern ramps to pattern cells 112.

In one embodiment, four groups g1, g2, g3, g4 of pattern cells are biased with different voltages v(g1), v(g2), v(g3), v(g4). Groups g1, g2, g3, g4 correspond to voltage distributions 1010, as illustrated. Average voltage 1012 of distributions 1010 is used as an estimate of an average threshold voltage for distribution 1002 of data cells in a logic 1 state.

In one example as illustrated, after biasing with the different voltages v(g1), v(g2), v(g3), v(g4), groups g1, g2, g3 do not switch. However, higher voltage v(g4) causes group g4 to switch. Based on the switching of group g4, a controller selects read voltage 1020 to apply to data cells during a read operation. The switching of data cells in the logic 1 state in response to applying read voltage 1020 is illustrated as distribution 1004.

In one embodiment, read voltage 1020 is determined by the controller based on the magnitude of voltage 1012 corresponding to pattern cells switching, to which is added an additional voltage value. In one example, the additional value is based on a statistical characteristic of data cell distribution 1002. In one example, the additional value is a multiple of a standard deviation determined for data cell distribution 1002. The additional voltage value is added to move the initial voltage applied to the data cells further into the right tail of the distribution to reduce the time needed to converge to a successful read of the data cells.

Distribution 1006 illustrates a number of pattern cells in group g4 that switch. As illustrated, the pattern cells switch at an earlier time than the data cells switch for distribution 1004. After voltage profile 1018 is used to apply voltage 1020 to the data cells, the voltage of profile 1018 is increased in steps. In a first step, a voltage 1022 is applied to the data cells, which causes additional data cells to switch as illustrated by distribution 1014. In an additional step, voltage 1024 is applied to the data cells, which causes yet further data cells to switch as illustrated by distribution 1016.

By using data results from applying voltages to the pattern cells as described herein to select read voltage(s), the extent of time and/or the number of voltage steps required for reading the data cells can be reduced. This increases the speed of the read operation for each codeword.

In one example, voltage profile 1018 starts at an initial voltage V(int) at time 1008. The rate at which the voltage of profile 1018 is increased to voltage 1020 can varied based on results from switching of pattern cells.

Figure 11:
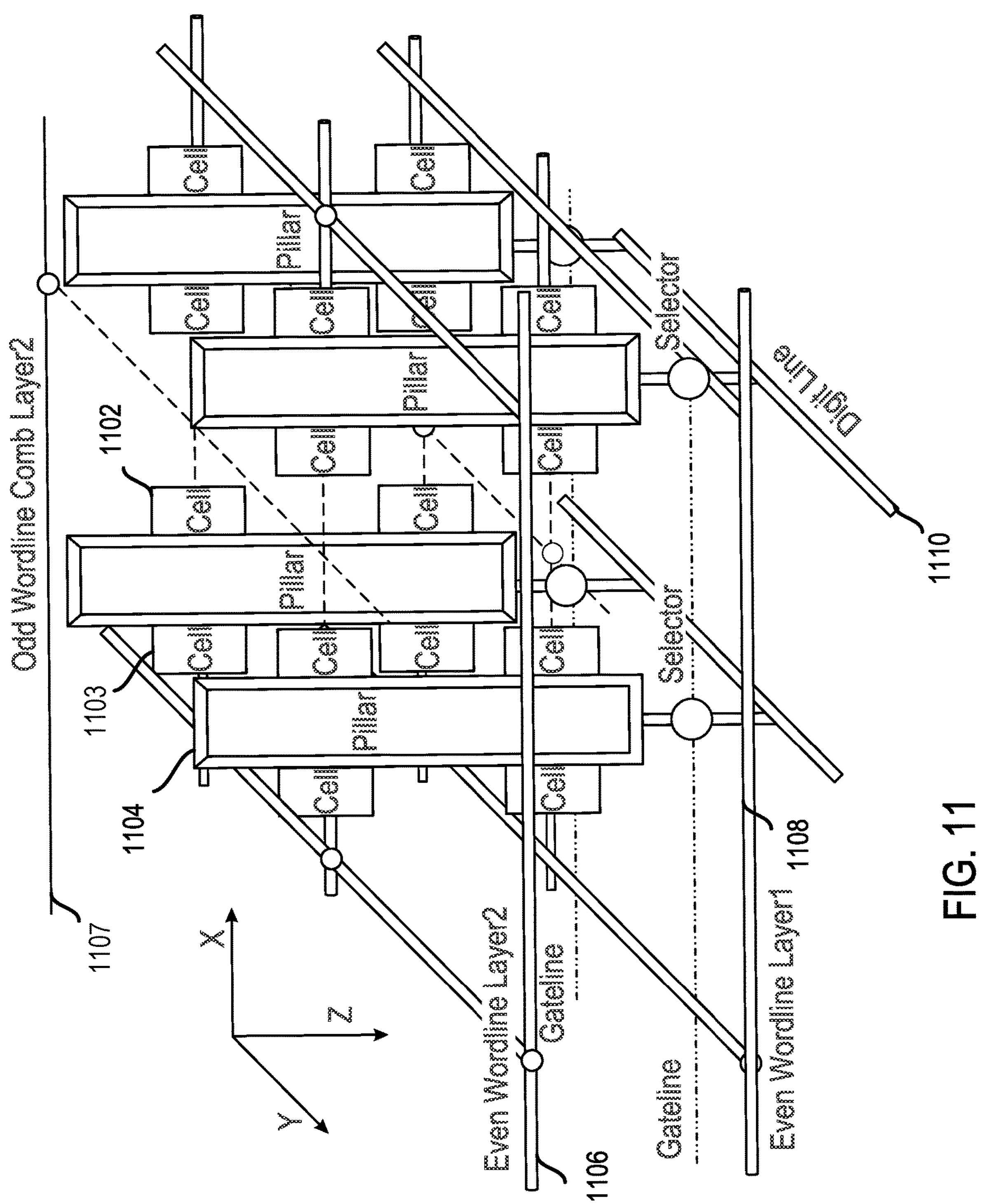
FIG. 11 shows an exemplary three-dimensional memory array structure, in accordance with some embodiments.

FIG. 11 shows an exemplary three-dimensional memory array structure, in accordance with some embodiments. The memory array and memory cells described herein are not limited to use in a planar architecture (e.g., with cells at crossing of wordlines (WLs) and bitlines (BLs) on different levels). Instead, the approach also can be used for vertical architectures (e.g., vertical BL pillars crossing horizontal WL planes).

An example of a vertical architecture that can be used with embodiments described in this disclosure is illustrated in FIG. 11. As illustrated, a memory array includes memory cells 1102, 1103. Each memory cell 1102, 1103 can be selected using a wordline (e.g., 1106, 1107, or 1108) and a digit line (e.g., 1110). Memory cells 1102, 1103 are an example of data cells 110 or pattern cells 112 of FIG. 1.

In one embodiment, each wordline extends in one of a plurality of horizontal planes of wordlines 1106, 1107, 1108 stacked vertically above a semiconductor substrate (not shown). Each digit line or bitline (e.g., 1110) includes a pillar 1104. Each pillar 1104 extends vertically away from the semiconductor substrate. Each memory cell 1102, 1103 is located on sides of one of pillars 1104.

In one embodiment, the memory array has a vertical array architecture comprising vertical bitlines (e.g., vertical pillars 1104) or digit lines intersecting a plurality of horizontal decks of wordlines (e.g., even wordlines 1106 and odd wordlines 1107). Each deck is configured as two interdigitated wordline combs so that each bitline or digit line forms two cells 1102, 1103 at each of the decks. In one example, even wordlines 1106 are interdigitated with odd wordlines 1107 in a comb structure as illustrated.

Figure 12:
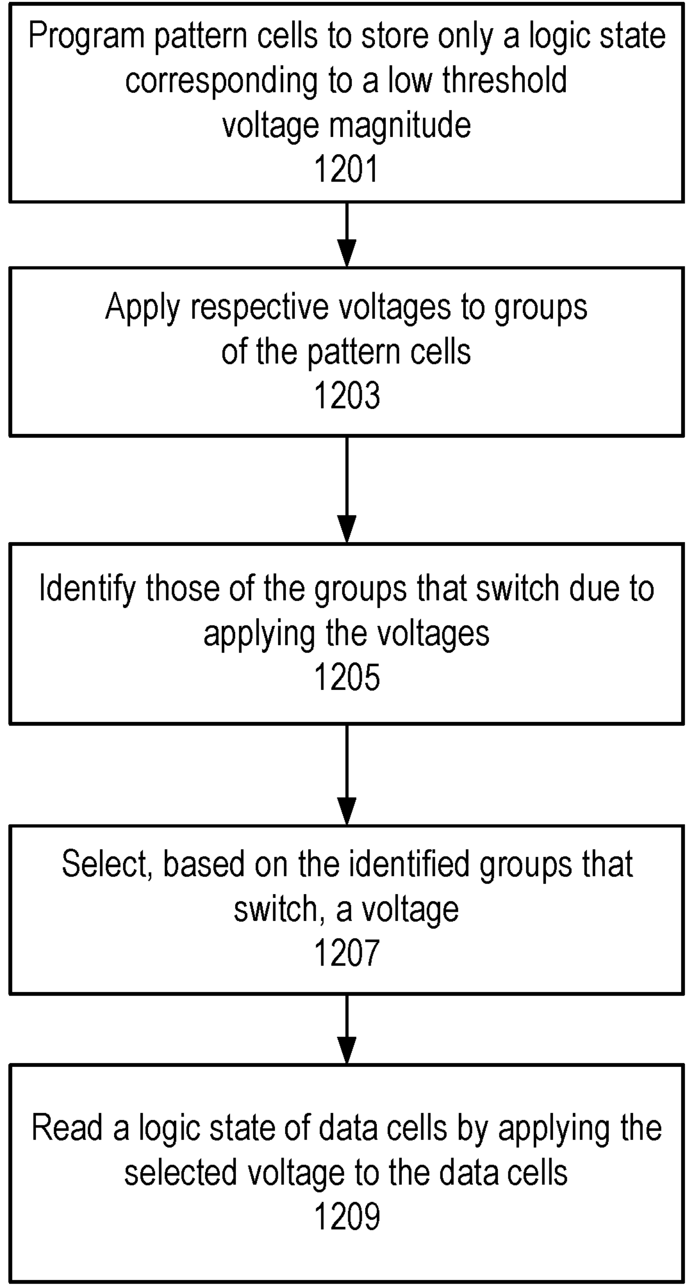
FIG. 12 shows a method for using multiple patterns to select a voltage for reading memory cells, in accordance with some embodiments.

FIG. 12 shows a method for using multiple patterns to select a voltage for reading memory cells, in accordance with some embodiments. For example, the method of FIG. 12 can be implemented in the system of FIG. 1.

The method of FIG. 12 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 12 is performed at least in part by one or more processing devices (e.g., controller 120 of FIG. 1).

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 1201, pattern cells are programmed to store only a logic state (e.g., logic 1, or SET state) corresponding to a low threshold voltage magnitude. In one example, pattern cells 112 are programmed to a logic 1 state. In one example, the pattern cells are programmed prior to performing a read operation on one or more codewords.

At block 1203, respective voltages are applied to groups of the pattern cells. In one example, pattern ramps 604 are applied to each of different groups of pattern cells. In one example, each of the ramps 604 is applied to a respective group at different voltages. In one example, the different voltages are separated by at least 0.2-0.6 V at any given time during ramping (e.g., while applying the ramps to the pattern cells).

At block 1205, those of the groups that switch due to applying the voltages are identified. In one example, a controller determines that group g2 switches first (e.g., at a lower magnitude of the applied voltages than for later groups g3, g4 that also switch).

At block 1207, a voltage is selected based on the identified groups that switch. In one example, the controller selects a read voltage based on the voltage(s) applied to cause pattern cells of group g2 to switch.

At block 1209, a logic state of data cells is read by applying the selected voltage to the data cells. In one example, controller 120 causes voltage profile 1018 to jump directly to the selected read voltage (e.g., no sensing is done on data cells until the selected read voltage is applied). In one example, the selected read voltage is voltage 1020 of FIG. 10.

In one embodiment, a system comprises: a memory array (e.g., 102) comprising pattern cells (e.g., 112) and data cells (e.g., 110), wherein the pattern cells are configured to store only a first logic state, and the data cells are configured to store the first logic state or a second logic state; bias circuitry configured to apply voltages to the pattern cells and data cells; sensing circuitry configured to read the pattern cells; and a controller configured to: apply, using the bias circuitry, first voltages (e.g., pattern ramps are applied to groups of pattern cells); determine, using the sensing circuitry, that at least a portion of the pattern cells switch (e.g., a second group of the groups switches first); determine, based on the portion of the pattern cells that switch, a second voltage (e.g., read voltage 1020 of FIG. 10); and apply, using the bias circuitry, the second voltage to the data cells.

In one embodiment, the controller is further configured to: determine that a number of the data cells that switch due to applying the second voltage is below a threshold (e.g., less than 40% of data cells in a codeword switch); in response to determining that the number is below the threshold, determine a third voltage by incrementing the second voltage (e.g., step up the read voltage by 0.3 V); and apply, using the bias circuitry, the third voltage to the data cells.

In one embodiment, the controller is further configured to determine a logic state for each of the data cells.

In one embodiment, the controller is further configured to, using the bias circuitry, program at least a first portion of the data cells by changing each data cell of the first portion from the first logic state to the second logic state, or from the second logic state to the first logic state.

In one embodiment, the data cells store data for a codeword to be read from the memory array.

In one embodiment, the pattern cells are configured as a plurality of groups including a first group and a second group; and the second voltage is determined based on whether the first or second group has switched.

In one embodiment, the first voltages are applied as steps of increasing magnitude corresponding to respective groups of the pattern cells; and the controller determines the second voltage based on the step corresponding to a first group of the groups to switch.

In one embodiment, the first voltages are applied to the groups in parallel (e.g., pattern ramps are applied to groups simultaneously for at least a portion of a read operation).

In one embodiment, the switching of the first group is determined based on whether a number of pattern cells in the first group that switch is greater than a threshold (e.g., greater than 40 to 70% of the total number of cells in the first group).

In one embodiment, the first logic state (e.g., a logic 1 or SET state in positive polarity) corresponds to a magnitude of threshold voltage that is less than a magnitude of threshold voltage corresponding to the second logic state (e.g., a logic 0 or RESET state in positive polarity).

In one embodiment, the controller is further configured to: receive a read command from a host device; and in response to receiving the read command, perform a read operation to retrieve data from the memory array; wherein the read operation comprises applying the first voltages, and applying the second voltage.

In one embodiment, the second voltage is determined further based on a threshold voltage distribution corresponding to at least one of the data cells or the pattern cells.

In one embodiment, applying the first voltages comprises applying a ramp to a group having only a portion of the pattern cells, the ramp having an initial voltage at a start of a read operation; the group is determined to switch after the ramp increases in magnitude from the initial voltage to a third voltage; and the second voltage is determined by adding a value (e.g., σ or 2σ) to the magnitude of the third voltage, the value corresponding to a statistical characteristic (e.g., standard deviation σ) of the threshold voltage distribution.

In one embodiment, applying the first voltages to the pattern cells comprises applying ramps in parallel to groups of the pattern cells, the ramps including a first ramp applied to a first group of the pattern cells; the first group is determined to switch when the first ramp increases to a third voltage (e.g., v(g4)); the second voltage (e.g., v(g4)+2a) is determined based on the third voltage; and applying the second voltage to the data cells comprises applying a second ramp to the data cells, and increasing the second ramp to the second voltage.

In one embodiment, the first ramp is of greater voltage magnitude than the second ramp during a read operation from a start of the read operation at least until a time at which the first group is determined to switch.

In one embodiment, the pattern cells are configured as groups including at least a first group and a second group; the applied first voltages include a first ramp applied to the first group; the applied first voltages include a second ramp applied to the second group; a voltage magnitude of the second ramp is greater than a voltage magnitude of the first ramp; and the second voltage is determined based on switching of the pattern cells in the second group.

In one embodiment, a voltage magnitude of the second ramp at a start of a read operation (e.g., read start) is less than the second voltage (e.g., v(g4)).

In one embodiment, the portion of the pattern cells switch (e.g., cells of group 4 switch at v(g4)) at least 10 nanoseconds before the second voltage (e.g., v(g4)) is applied to the data cells.

In one embodiment, the first voltages are applied to groups of the pattern cells, and the first voltages applied to some of the groups have a greater magnitude than the second voltage (e.g., the voltages applied to groups 2, 3, 4 are respectively v(g2), v(g3), v(g4), and the second voltage applied to the data cells is the lowest voltage v(g2) for group 2, which is the first of the groups to switch).

In one embodiment, a device comprises: a memory array comprising data cells and groups (e.g., g1, g2, g3, g4) of pattern cells; bias circuitry configured to apply voltages to the data cells and the groups of pattern cells; sensing circuitry configured to read each of the pattern cells; and a controller configured to: apply, using the bias circuitry, first voltages to the groups of pattern cells; determine, using the sensing circuitry, which of the groups switch due to applying the first voltages; select, based on the groups determined to switch, a second voltage; and read the data cells by applying the second voltage to the data cells using the bias circuitry.

In one embodiment, the memory array has a vertical array architecture comprising vertical bitlines or digit lines intersecting a plurality of horizontal decks of wordlines.

In one embodiment, each deck is configured as two interdigitated wordline combs so that each bitline or digit line forms two cells at each of the decks.

In one embodiment, applying the first voltages comprises applying a voltage of a different magnitude to each group.

In one embodiment, the first voltages are separated from one another by equal voltage steps.

In one embodiment, the first voltages are separated from one another by voltage steps that vary in size.

In one embodiment, the controller is further configured to: after applying the second voltage, determine whether a number of data cells read is sufficient; in response to determining that the number of data cells read is not sufficient, adding a step to the second voltage to determine a third voltage; and read the data cells by applying the third voltage to the data cells using the bias circuitry.

In one embodiment, determining whether the number of data cells read is sufficient comprises determining an error rate associated with reading the data cells. In one embodiment, a number of the pattern cells is less than 20% of a number of the data cells.

In one embodiment, the pattern cells are configured to have a same operating history as the data cells.

In one embodiment, a first group is determined as being first to switch of the groups of pattern cells; the first group comprises first cells that switch and second cells that do not switch; and the second voltage is selected based on an average of threshold voltages for the first cells that switch.

In one embodiment, a method comprises: programming pattern cells to store only a first logic state (e.g., logic 1) corresponding to a first threshold voltage magnitude; applying respective first voltages to groups of the pattern cells; identifying those of the groups that switch due to applying the first voltages; selecting, based on the identified groups that switch, a second voltage; and reading a logic state of data cells by applying the second voltage to the data cells, wherein the data cells store either the first logic state, or a second logic state (e.g., logic 0) corresponding to a second threshold voltage magnitude greater than the first threshold voltage magnitude.

The disclosure includes various devices which perform the methods and implement the systems described above, including data processing systems which perform these methods, and computer-readable media containing instructions which when executed on data processing systems cause the systems to perform these methods.

The description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

In this description, various functions and/or operations may be described as being performed by or caused by software code to simplify description. However, those skilled in the art will recognize what is meant by such expressions is that the functions and/or operations result from execution of the code by one or more processing devices, such as a microprocessor, Application-Specific Integrated Circuit (ASIC), graphics processor, and/or a Field-Programmable Gate Array (FPGA). Alternatively, or in combination, the functions and operations can be implemented using special purpose circuitry (e.g., logic circuitry), with or without software instructions. Embodiments can be implemented using hardwired circuitry without software instructions, or in combination with software instructions. Thus, the techniques are not limited to any specific combination of hardware circuitry and software, nor to any particular source for the instructions executed by a computing device.

While some embodiments can be implemented in fully functioning computers and computer systems, various embodiments are capable of being distributed as a computing product in a variety of forms and are capable of being applied regardless of the particular type of computer-readable medium used to actually effect the distribution.

At least some aspects disclosed can be embodied, at least in part, in software. That is, the techniques may be carried out in a computing device or other system in response to its processing device, such as a microprocessor, executing sequences of instructions contained in a memory, such as ROM, volatile RAM, non-volatile memory, cache or a remote storage device.

Routines executed to implement the embodiments may be implemented as part of an operating system, middleware, service delivery platform, SDK (Software Development Kit) component, web services, or other specific application, component, program, object, module or sequence of instructions (sometimes referred to as computer programs). Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A computer-readable medium can be used to store software and data which when executed by a computing device causes the device to perform various methods. The executable software and data may be stored in various places including, for example, ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a computer-readable medium in entirety at a particular instance of time.

Examples of computer-readable media include, but are not limited to, recordable and non-recordable type media such as volatile and non-volatile memory devices, read only memory (ROM), random access memory (RAM), flash memory devices, solid-state drive storage media, removable disks, magnetic disk storage media, optical storage media (e.g., Compact Disk Read-Only Memory (CD ROMs), Digital Versatile Disks (DVDs), etc.), among others. The computer-readable media may store the instructions. Other examples of computer-readable media include, but are not limited to, non-volatile embedded devices using NOR flash or NAND flash architectures. Media used in these architectures may include un-managed NAND devices and/or managed NAND devices, including, for example, eMMC, SD, CF, UFS, and SSD.

In general, a non-transitory computer-readable medium includes any mechanism that provides (e.g., stores) information in a form accessible by a computing device (e.g., a computer, mobile device, network device, personal digital assistant, manufacturing tool having a controller, any device with a set of one or more processors, etc.). A "computer-readable medium" as used herein may include a single medium or multiple media (e.g., that store one or more sets of instructions).

In various embodiments, hardwired circuitry may be used in combination with software and firmware instructions to implement the techniques. Thus, the techniques are neither limited to any specific combination of hardware circuitry and software nor to any particular source for the instructions executed by a computing device.

Various embodiments set forth herein can be implemented using a wide variety of different types of computing devices. As used herein, examples of a "computing device" include, but are not limited to, a server, a centralized computing platform, a system of multiple computing processors and/or components, a mobile device, a user terminal, a vehicle, a personal communications device, a wearable digital device, an electronic kiosk, a general purpose computer, an electronic document reader, a tablet, a laptop computer, a smartphone, a digital camera, a residential domestic appliance, a television, or a digital music player. Additional examples of computing devices include devices that are part of what is called "the internet of things" (IOT). Such "things" may have occasional interactions with their owners or administrators, who may monitor the things or modify settings on these things. In some cases, such owners or administrators play the role of users with respect to the "thing" devices. In some examples, the primary mobile device (e.g., an Apple iPhone) of a user may be an administrator server with respect to a paired "thing" device that is worn by the user (e.g., an Apple watch).

In some embodiments, the computing device can be a computer or host system, which is implemented, for example, as a desktop computer, laptop computer, network server, mobile device, or other computing device that includes a memory and a processing device. The host system can include or be coupled to a memory sub-system so that the host system can read data from or write data to the memory sub-system. The host system can be coupled to the memory sub-system via a physical host interface. In general, the host system can access multiple memory sub-systems via a same communication connection, multiple separate communication connections, and/or a combination of communication connections.

In some embodiments, the computing device is a system including one or more processing devices. Examples of the processing device can include a microcontroller, a central processing unit (CPU), special purpose logic circuitry (e.g., a field programmable gate array (FPGA), an application specific integrated circuit (ASIC), etc.), a system on a chip (SoC), or another suitable processor.

In one example, a computing device is a controller of a memory system. The controller includes a processing device and memory containing instructions executed by the processing device to control various operations of the memory system.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A system comprising:

a memory array comprising pattern cells and data cells, wherein the pattern cells are configured to store a first logic state, and the data cells are configured to store the first logic state or a second logic state; and a controller configured to:

apply first voltages to the pattern cells;

determine a portion of the pattern cells switch;

determine that a number of the data cells that switch due to applying a second voltage is below a threshold;

in response to determining that the number is below the threshold, determine a third voltage by incrementing the second voltage; and apply, using bias circuitry, the third voltage to the data cells.

2. The system of claim 1, wherein the controller is further configured to determine a logic state for each of the data cells.

3. The system of claim 2, wherein the controller is further configured to, using bias circuitry, program at least a first portion of the data cells by changing each data cell of the first portion from the first logic state to the second logic state, or from the second logic state to the first logic state.

4. The system of claim 1, wherein the data cells store data for a codeword to be read from the memory array, and the controller is further configured to: determine, based on the portion of the pattern cells that switch, a second voltage; and apply the second voltage to the data cells.

5. The system of claim 1, wherein:

the pattern cells are configured as a plurality of groups including a first group and a second group; and a second voltage to apply to the data cells is determined based on whether the first or second group has switched.

6. The system of claim 1, wherein:

the first voltages are applied as steps of increasing magnitude corresponding to respective groups of the pattern cells; and the controller determines a second voltage to apply to the data cells based on the step corresponding to a first group of the groups to switch.

7. The system of claim 6, wherein the first voltages are applied to the groups in parallel.

8. The system of claim 6, wherein the switching of the first group is determined based on whether a number of pattern cells in the first group that switch is greater than a threshold.

9. The system of claim 1, wherein the first logic state corresponds to a magnitude of threshold voltage that is less than a magnitude of threshold voltage corresponding to the second logic state.

10. The system of claim 1, wherein the controller is further configured to:

receive a read command from a host device; and in response to receiving the read command, perform a read operation to retrieve data from the memory array;

wherein the read operation comprises applying the first voltages, and applying a second voltage to the data cells.

11. The system of claim 1, wherein a second voltage to apply to the data cells is determined based on a threshold voltage distribution corresponding to at least one of the data cells or the pattern cells.

12. The system of claim 11, wherein:

applying the first voltages comprises applying a ramp to a group having only a portion of the pattern cells, the ramp having an initial voltage at a start of a read operation;

the group is determined to switch after the ramp increases in magnitude from the initial voltage to a third voltage; and a second voltage to apply to the data cells is determined by adding a value to the magnitude of the third voltage, the value corresponding to a statistical characteristic of the threshold voltage distribution.

13. The system of claim 1, wherein:

applying the first voltages to the pattern cells comprises applying ramps in parallel to groups of the pattern cells, the ramps including a first ramp applied to a first group of the pattern cells;

the first group is determined to switch when the first ramp increases to a third voltage;

a second voltage to apply to the data cells is determined based on the third voltage; and applying the second voltage to the data cells comprises applying a second ramp to the data cells, and increasing the second ramp to the second voltage.

14. The system of claim 13, wherein the first ramp is of greater voltage magnitude than the second ramp during a read operation from a start of the read operation at least until a time at which the first group is determined to switch.

15. The system of claim 1, wherein:

the pattern cells are configured as groups including at least a first group and a second group;

the applied first voltages include a first ramp applied to the first group;

the applied first voltages include a second ramp applied to the second group;

a voltage magnitude of the second ramp is greater than a voltage magnitude of the first ramp; and a second voltage to apply to the data cells is determined based on switching of the pattern cells in the second group.

16. The system of claim 15, wherein a voltage magnitude of the second ramp at a start of a read operation is less than the second voltage.

17. The system of claim 1, wherein the portion of the pattern cells switch at least 10 nanoseconds before a second voltage is applied to the data cells.

18. The system of claim 1, wherein the first voltages are applied to groups of the pattern cells, and the first voltages applied to some of the groups have a greater magnitude than a second voltage applied to the data cells.

19. A method comprising:

programming pattern cells to store only a first logic state;

applying respective first voltages to groups of the pattern cells;

identifying those of the groups that switch due to applying the first voltages; and selecting, based on the identified groups that switch, a second voltage for reading a logic state of data cells.

20. The method of claim 19, wherein the first logic state corresponds to a first threshold voltage magnitude.

21. The method of claim 20, wherein:

reading the logic state comprises applying the second voltage to the data cells; and the data cells store either the first logic state, or a second logic state corresponding to a second threshold voltage magnitude greater than the first threshold voltage magnitude.

22. A system comprising:

first memory cells configured to store only a first logic state; and a controller configured to:

determine at least one characteristic of the first memory cells; and read second memory cells using at least one voltage selected based on the at least one characteristic.

* * * * *